(12) United States Patent
Mei et al.

(10) Patent No.: US 12,289,998 B2
(45) Date of Patent: Apr. 29, 2025

(54) THERMOELECTRIC CELL, THERMOELECTRIC CELL MANUFACTURING METHOD, AND THERMOELECTRIC BODY MANUFACTURING METHOD

(71) Applicants: Sanoh Industrial Co., Ltd., Tokyo (JP); TOKYO INSTITUTE OF TECHNOLOGY, Tokyo (JP)

(72) Inventors: Biao Mei, Koga (JP); Sachiko Matsushita, Tokyo (JP)

(73) Assignees: Sanoh Industrial Co., Ltd., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 18/334,747

(22) Filed: Jun. 14, 2023

(65) Prior Publication Data

US 2023/0329114 A1 Oct. 12, 2023

Related U.S. Application Data

(62) Division of application No. 17/418,169, filed as application No. PCT/JP2019/047967 on Dec. 6, 2019, now Pat. No. 11,737,363.

(30) Foreign Application Priority Data

Dec. 28, 2018 (JP) .................... 2018-248082

(51) Int. Cl.
*H10N 10/17* (2023.01)
*H10N 10/01* (2023.01)

(52) U.S. Cl.
CPC ............. *H10N 10/17* (2023.02); *H10N 10/01* (2023.02)

(58) Field of Classification Search
None
See application file for complete search history.

(56) References Cited

U.S. PATENT DOCUMENTS

2020/0136101 A1* 4/2020 Ardebili ............... H01M 4/747

FOREIGN PATENT DOCUMENTS

JP 2006073632 A 3/2006
JP 2010056067 A 3/2010
(Continued)

OTHER PUBLICATIONS

English machine translation of Matsushita (WO-2017038988-A1) provided by the EPO website, 2022, All Pages. (Year: 2022).*
(Continued)

*Primary Examiner* — Daniel P Malley, Jr.
(74) *Attorney, Agent, or Firm* — PROCOPIO, CORY, HARGREAVES & SAVITCH LLP

(57) ABSTRACT

A thermoelectric cell includes a thermoelectric body including heat-utilizing power generating elements in each of which a thermoelectric conversion layer and a solid electrolyte layer are layered, and converting thermal energy into electrical energy, a conductive case including a first case body and a second case body which are combined in an insulated state and accommodating the thermoelectric body, an insulating member electrically insulating the first case body or the second case body and the solid electrolyte layer on a side surface of the thermoelectric body while electrically insulating the first case body and the second case body, and a compressible conductor accommodated in the case and compressed by being sandwiched between the thermoelectric body and the case. The first case body, the thermoelectric body, and the second case body are electrically connected in a stacked direction.

17 Claims, 5 Drawing Sheets

(56) References Cited

FOREIGN PATENT DOCUMENTS

| JP | 2012064460 A | | 3/2012 | |
|---|---|---|---|---|
| JP | 2016060887 A | * | 4/2016 | |
| WO | WO-2017038988 A1 | * | 3/2017 | ............ H01L 35/32 |
| WO | 2018/200487 A1 | | 11/2018 | |

OTHER PUBLICATIONS

Gibb, "An Introduction to Invar", https://wp.optics.arizona.edu/optomech/wp-content/uploads/sites/53/2016/10/GibbPresentation.pdf, 2006, All Pages. (Year: 2006).*
English machine translation of Aoki (JP-2016060887-A) provided by the EPO website, 2022, All Pages. (Year: 2022).*
International Search Report for related PCT App No. PCT/JP2019/047967 dated Feb. 18, 2020, 2 pgs.
Japanese Patent Office, Notice of Reasons for Refusal, Application No. JP 2018-248082, dated Nov. 22, 2022, in 8 pages.
International Preliminary Report on Patentability for related PCT App No. PCT/JP2018/047967 dated Jul. 8, 2021, 9 pgs.

\* cited by examiner (a)

(b)

(c)

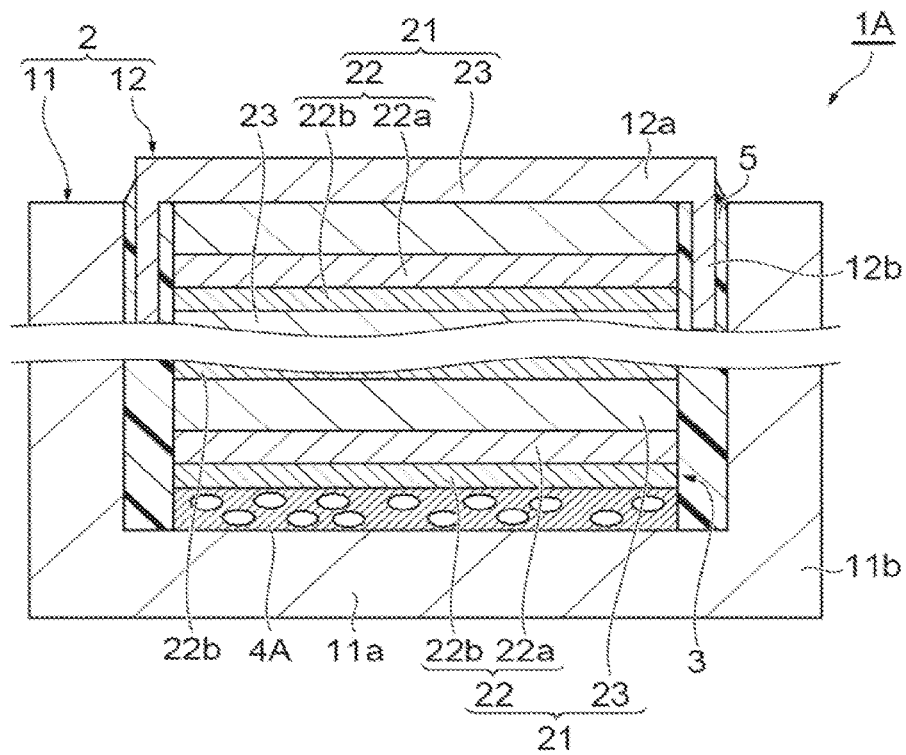
Fig.5 (a)
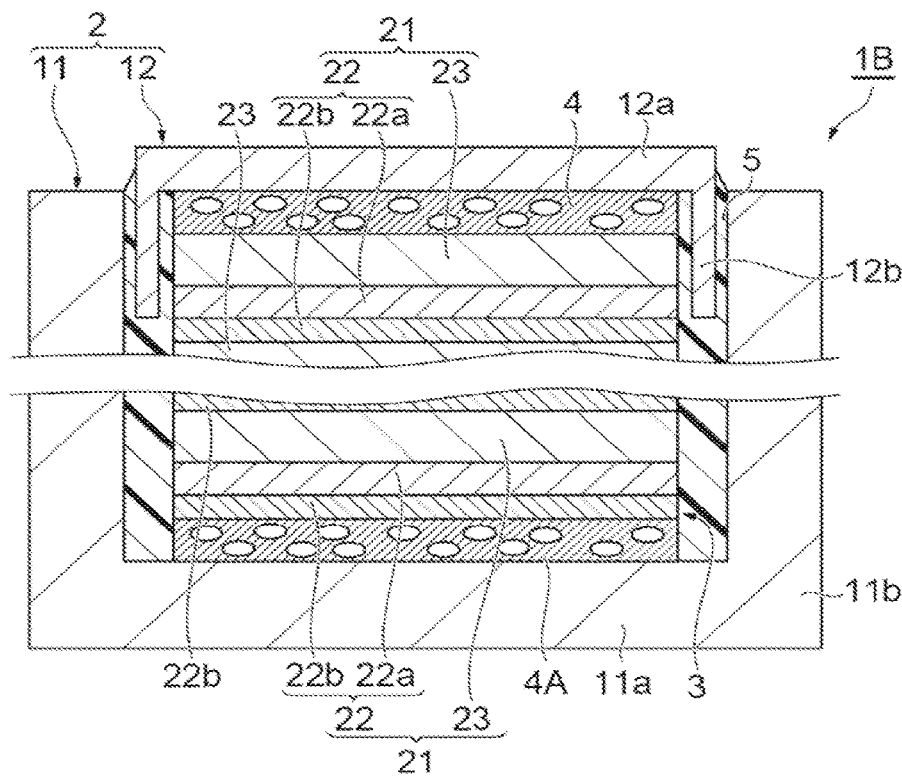
(b)

THERMOELECTRIC CELL, THERMOELECTRIC CELL MANUFACTURING METHOD, AND THERMOELECTRIC BODY MANUFACTURING METHOD

This application is a continuation of U.S. application Ser. No. 17/418,169 filed on Jun. 24, 2021 which claims benefit to US National Stage of International Patent Application PCT/JP2019/047967, filed on Dec. 6, 2019, which claims benefit of priority from Japanese Patent Application 2018-248082, filed on Dec. 28, 2018, the contents of which are incorporated herein by reference.

TECHNICAL FIELD

One aspect of the present invention relates to a thermoelectric cell, a thermoelectric cell manufacturing method, and a thermoelectric body manufacturing method, and particularly to a thermoelectric cell, a thermoelectric cell manufacturing method, and a thermoelectric body manufacturing method, which exhibit a thermoelectric conversion function.

BACKGROUND ART

As a heat-utilizing power generation using geothermal heat, exhaust heat of a factory, or the like, a method using the Seebeck effect can be included. In addition, as a heat-utilizing power generation that does not use the Seebeck effect, a heat-utilizing power generating element disclosed in Patent Literature 1 below can be included. Patent Literature 1 below discloses that thermal energy is converted into electrical energy by combining an electrolyte and a thermoelectric conversion material that generates a thermal excitation electron and a hole. By using such a heat-utilizing power generating element as a power source for an electronic component, stable power can be supplied to the electronic component, for example, even under a high-temperature environment (for example, 50° C. or more) where a general cell easily deteriorates. Therefore, research and development have been carried out for the practical use of the above-described heat-utilizing power generating element. One of the themes of research and development includes a practical package structure of the above-described heat-utilizing power generating element from the viewpoint of ensuring ease of replacement with a conventional cell.

CITATION LIST

Patent Literature

[Patent Literature 1] International Publication No. WO 2017/038988
[Patent Literature 2] Japanese Unexamined Patent Publication No. 2010-56067

SUMMARY OF INVENTION

Technical Problem

However, as a kind of cell, a coin-type cell (button-type cell) can be included. The coin-type cell requires a power source in an independent state from an external power source, and is mainly used for electronic components having low power consumption. Patent Literature 2 discloses a coin-type lithium secondary cell in which a spring is accommodated as a countermeasure against variation in contact surface pressure caused by expansion or the like due to use.

In order to obtain a cell that can be practically used under a high-temperature environment, for example, it is conceivable to combine the coin-type cell as disclosed in Patent Literature 2 with a heat-utilizing power generating element disclosed in Patent Literature 1. However, it is not possible to obtain a cell that can withstand practical use from the viewpoint of electromotive force, reliability, and the like, by merely implementing the above-described combination. Therefore, further improvement is required.

An object of one aspect of the present invention is to provide a thermoelectric cell, a thermoelectric cell manufacturing method, and a thermoelectric body manufacturing method that can be practically used under a high-temperature environment.

Solution to Problem

A thermoelectric cell according to one aspect of the present invention includes a thermoelectric body including heat-utilizing power generating elements in each of which a thermoelectric conversion layer and a solid electrolyte layer are layered, and converting thermal energy into electrical energy, a conductive case including a first case body and a second case body which are combined in an insulated state and accommodating the thermoelectric body, an insulating member electrically insulating the first case body or the second case body and the solid electrolyte layer on a side surface of the thermoelectric body while electrically insulating the first case body and the second case body, and a compressible conductor accommodated in the case and compressed by being sandwiched between the thermoelectric body and the case, in which the first case body, the thermoelectric body, and the second case body are electrically connected in a stacked direction of the thermoelectric conversion layer and the solid electrolyte layer by disposing the compressible conductor on a side of at least one of the first case body and the second case body.

The above-described thermoelectric cell includes the thermoelectric body that generates power by applying heat. The thermoelectric body has heat-utilizing power generating elements that are layered in the stacked direction. As a result, the electromotive force of the thermoelectric cell can be improved. In addition, the compressible conductor is accommodated in the case accommodating the thermoelectric body. As a result, it is possible to prevent unnecessary pressure from being applied to the thermoelectric body, so that damage to the thermoelectric body can be reduced. Further, since the compressible conductor is interposed between the case and the thermoelectric body, poor contact between the case and the thermoelectric body can be satisfactorily prevented. Therefore, according to the above-described aspect, it is possible to provide a thermoelectric cell that can be practically used under a high-temperature environment.

The thermoelectric conversion layer may have an electron thermal excitation layer and an electron transport layer, which are layered in this order, and the electron thermal excitation layer may be in contact with the solid electrolyte layer. In this case, since the electrons are satisfactorily taken out from the electron thermal excitation layer via the electron transport layer, the performance of the thermoelectric body can be improved.

The compressible conductor may be a metal porous body. In this case, the pressure applied to the thermoelectric body from the case via the compressible conductor can be reduced by easily plastically deforming the compressible conductor. Therefore, the damage to the thermoelectric body can be reduced.

In the above-described thermoelectric cell, the compressible conductors may be disposed on both sides of the first case body and the second case body. In this case, poor contact between the first case body and the thermoelectric body and poor contact between the second case body and the thermoelectric body can be satisfactorily prevented.

Each of the first case body and the second case body may have a bottomed cylindrical shape in which one end is closed and the other end is open.

A thermoelectric cell manufacturing method according to another aspect of the present invention includes obtaining a thermoelectric body by forming a heat-utilizing power generating element formed by repeatedly stacking a thermoelectric conversion layer and a solid electrolyte layer, accommodating the thermoelectric body and a compressible conductor in either a first case body or a second case body having conductivity, and accommodating the thermoelectric body in the case by combining the first case body and the second case body with an insulating member interposed therebetween such that the first case body or the second case body accommodating the thermoelectric body and a side surface of the thermoelectric body are electrically insulated and the first case body and the second case body are electrically insulated.

By the above-described manufacturing method, it is possible to provide a thermoelectric cell manufacturing method that can be practically used under a high-temperature environment.

A thermoelectric body manufacturing method according to further another aspect of the present invention is a thermoelectric body manufacturing method including heat-utilizing power generating elements in each of which a thermoelectric conversion layer and a solid electrolyte layer are layered, and the method includes obtaining the thermoelectric body by multiple times repeating forming the solid electrolyte on the thermoelectric conversion layer after forming the thermoelectric conversion layer. By the manufacturing method, it is possible to provide a thermoelectric body manufacturing method that can be practically used.

Advantageous Effects of Invention

According to one aspect of the present invention, it is possible to provide a thermoelectric cell, a thermoelectric cell manufacturing method, and a thermoelectric body manufacturing method that can be practically used under a high-temperature environment.

Figure 3:
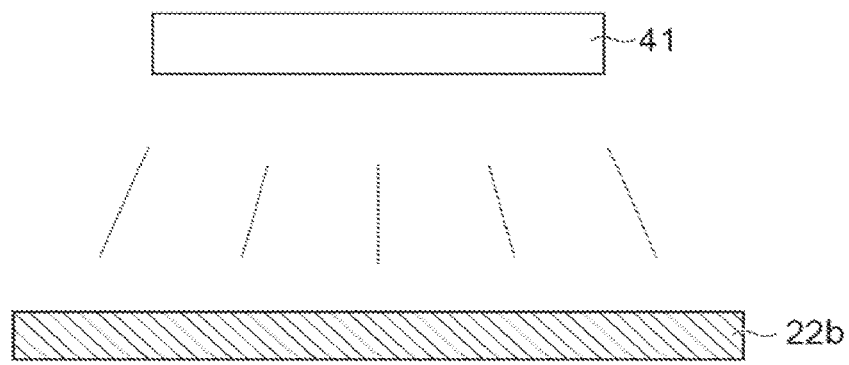
Figure 3:
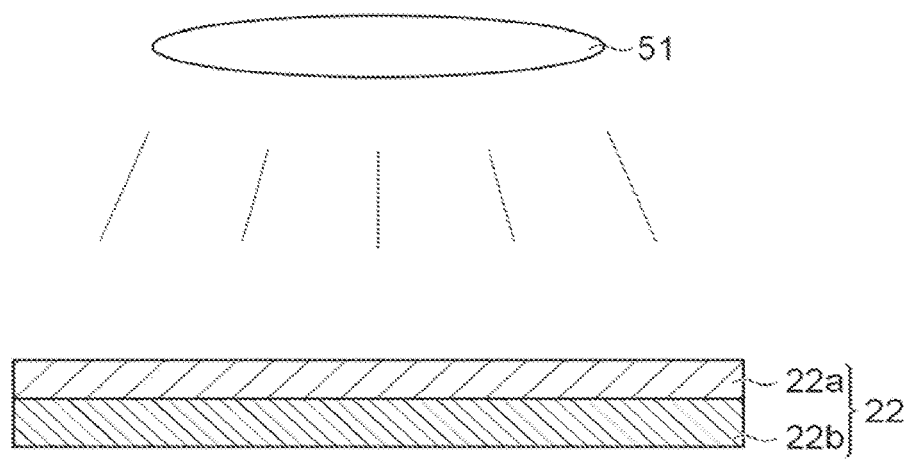
Figure 3:
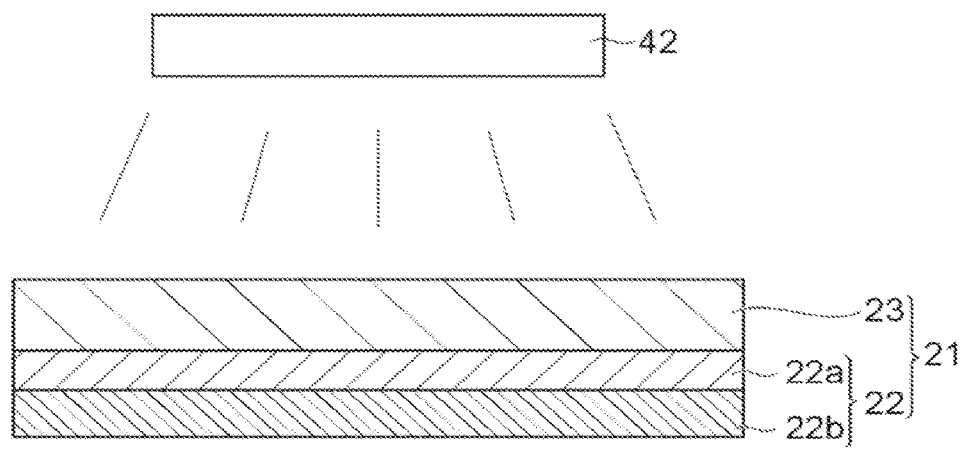

(a) to (c) of FIG. 3 are diagrams illustrating a thermoelectric body manufacturing method.

Figure 4:
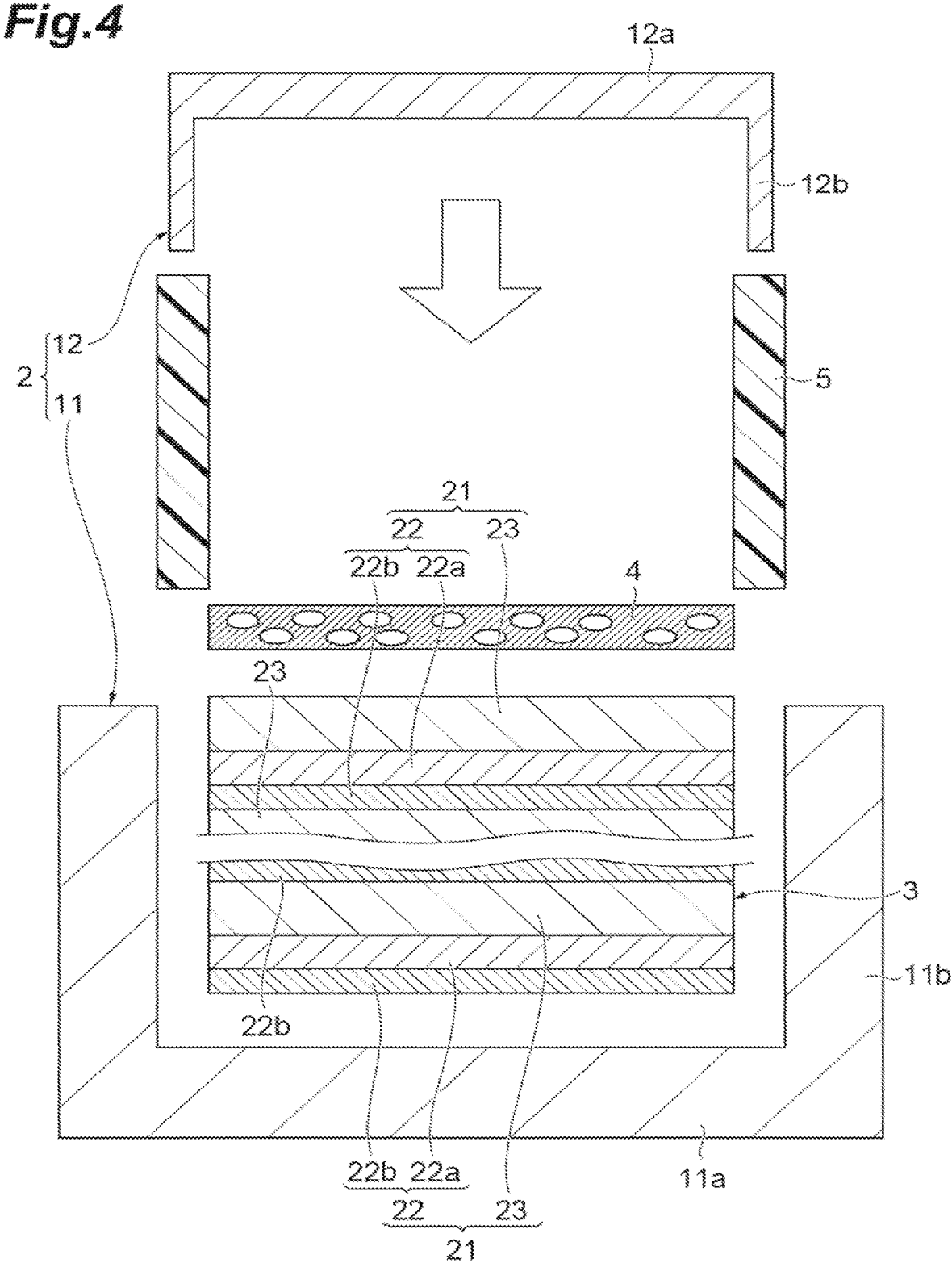

FIG. 4 is a diagram illustrating a thermoelectric cell manufacturing method.

(a) of FIG. 5 is a schematic cross-sectional diagram showing a thermoelectric cell according to a first modification example of an embodiment, and (b) of FIG. 5 is a schematic cross-sectional diagram showing a thermoelectric cell according to a second modification example of an embodiment.

DESCRIPTION OF EMBODIMENTS

Hereinafter, embodiments of the present invention will be described in detail with reference to the accompanying drawings. In the following explanation, the same reference numerals will be used for the same elements or elements having the same function, and duplicate explanation will be omitted.

Figure 1:
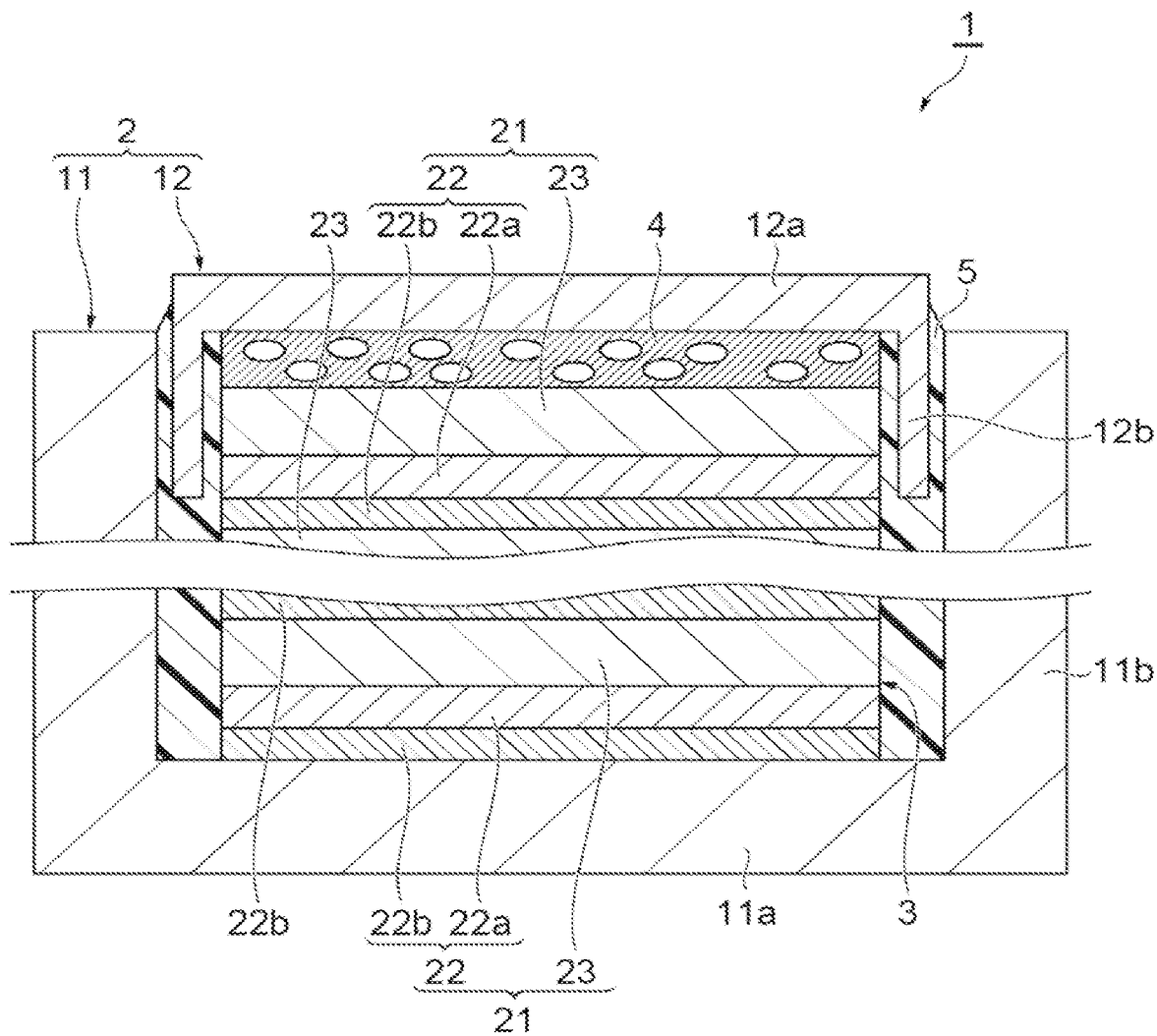
FIG. 1 is a schematic cross-sectional diagram showing a thermoelectric cell according to an embodiment.

First, a configuration of a coin cell according to the present embodiment will be described with reference to FIG. 1. FIG. 1 is a schematic cross-sectional diagram showing a thermoelectric cell according to the present embodiment. The thermoelectric cell 1 shown in FIG. 1 is a heat-utilizing power generating device that generates power by supplying heat from the outside. A thermoelectric cell 1 has a case 2, a thermoelectric body 3, a compressible conductor 4, and a gasket 5. The gasket 5 corresponds to an example of an insulating member.

The case 2 is a hollow container made of a metal or alloy exhibiting conductivity, and has a housing 11 and a lid 12. In the present embodiment, the case 2 is made of stainless steel. One of the housing 11 and the lid 12 corresponds to an example of one of the first case body and the second case body, and the other of the housing 11 and the lid 12 corresponds to an example of the other of the first case body and the second case body.

The housing 11 is a member that functions as one of a positive electrode and a negative electrode in the thermoelectric cell 1, and accommodates the thermoelectric body 3, the compressible conductor 4, and the gasket 5. The housing 11 has a bottom plate 11a and a side wall 11b. The bottom plate 11a has, for example, a disk shape, an elliptical plate shape, a polygonal plate shape, or the like. The side wall 11b is provided along an edge of the bottom plate 11a. In the present embodiment, since the bottom plate 11a has a disk shape, the housing 11 has a bottomed cylindrical shape in which one end thereof is closed by the bottom plate 11a and the other end is open.

The lid 12 is a member that functions as the other of the positive electrode and the negative electrode in the thermoelectric cell 1, and seals the housing 11 via the gasket 5. The lid 12 has a top plate 12a and a side wall 12b. The top plate 12a has, for example, a disk shape, an elliptical plate shape, a polygonal plate shape, or the like. The diameter of the top plate 12a is smaller than the inner diameter of the housing 11. Therefore, when the housing 11 and the lid 12 are combined, the lid 12 is disposed to be surrounded by the side wall 11b of the housing 11. The side wall 12b is provided along the edge of the top plate 12a and extends toward the bottom plate 11a. In the present embodiment, since the top plate 12a also has a disk shape, the lid 12 has a bottomed cylindrical shape in which one end thereof is closed by the top plate 12a and the other end is open.

The thermoelectric body 3 is a member that generates power by supplying heat from the outside (that is, a member that converts thermal energy into electrical energy), and is electrically connected to the housing 11 and the lid 12 of the case 2. In the present embodiment, the thermoelectric body 3 is in contact with the bottom plate 11a of the housing 11, while being separated from the side wall 11b and the lid 12 of the housing 11. Since the gasket 5 exists between the thermoelectric body 3 and the side walls 11b and 12b, a short circuit of the thermoelectric cell 1 can be prevented. When the thermoelectric body 3 is accommodated in the case 2, the thermoelectric body 3 is disposed to be surrounded by the side wall 12b of the lid 12.

The thermoelectric body 3 has a plurality of heat-utilizing power generating elements 21 that are layered. For example, the thermoelectric body 3 has one or more and 10 or less heat-utilizing power generating elements 21. Each heat-utilizing power generating element 21 generates a thermal excitation electron and a hole by supplying heat from the outside. The generation of the thermal excitation electron and the hole by the heat-utilizing power generating element 21 is carried out, for example, at 25° C. or more and 300° C. or less. From the viewpoint of generating a sufficient number of the thermal excitation electron and the hole, the heat-utilizing power generating element 21 may be heated to 50° C. or more when the thermoelectric cell 1 is used. From the viewpoint of satisfactorily preventing deterioration of the heat-utilizing power generating element 21, the heat-utilizing power generating element 21 may be heated to 200° C. or less when the thermoelectric cell 1 is used. A temperature at which a sufficient number of the thermal excitation electrons are generated is, for example, "a temperature at which a density of the thermal excitation electron of the heat-utilizing power generating element 21 is $10^{15}/cm^3$ or more".

The plurality of heat-utilizing power generating elements 21 are layered along a direction in which the housing 11 and the lid 12 of the case 2 are combined (hereinafter, simply referred to as "stacked direction"). Each heat-utilizing power generating element 21 is connected in series. Each of the plurality of heat-utilizing power generating elements 21 has a thermoelectric conversion layer 22 and a solid electrolyte layer 23 that are layered in the stacked direction. By alternately stacking the thermoelectric conversion layer 22 and the solid electrolyte layer 23, the thermoelectric body 3 in which the thermoelectric conversion layer 22 and the solid electrolyte layer 23 are repeatedly layered is formed. The thermoelectric conversion layer 22 has an electron thermal excitation layer 22a and an electron transport layer 22b that are layered in the stacked direction.

The electron thermal excitation layer 22a is a layer that generates the thermal excitation electron and the hole in the heat-utilizing power generating element 21, and is in contact with the solid electrolyte layer 23. The electron thermal excitation layer 22a includes a thermoelectric conversion material. The thermoelectric conversion material is a material in which an excitation electron increases under a high-temperature environment, for example, a semiconductor material such as a metal semiconductor (Si, Ge), a tellurium compound semiconductor, a silicon germanium (Si—Ge) compound semiconductor, a silicide compound semiconductor, a skutterudite compound semiconductor, a clathrate compound semiconductor, a Heusler compound semiconductor, a half-Heusler compound semiconductor, a metal oxide semiconductor, an organic semiconductor, and the like. From the viewpoint of generating sufficient thermal excitation electrons at a relatively low temperature, the thermoelectric conversion material may be germanium (Ge). The electron thermal excitation layer 22a may include a plurality of thermoelectric conversion materials. The electron thermal excitation layer 22a may include a material other than the thermoelectric conversion material. For example, the electron thermal excitation layer 22a may include a binder for binding the thermoelectric conversion material, a sintering aid for assisting the molding of the thermoelectric conversion material, and the like. The electron thermal excitation layer 22a is formed by, for example, a squeegee method, a screen printing method, a discharge plasma sintering method, a compression molding method, a sputtering method, a vacuum deposition method, a chemical vapor deposition method (CVD method), a spin coating method, or the like.

The electron transport layer 22b is a layer that transports the thermal excitation electron generated in the electron thermal excitation layer 22a to the outside, and is located on the opposite side of the solid electrolyte layer 23 via the electron thermal excitation layer 22a in the stacked direction. In the present embodiment, the electron transport layer 22b closest to the bottom plate 11a of the housing 11 in the thermoelectric body 3 is in contact with the bottom plate 11a. The electron transport layer 22b includes an electron transport material. The electron transport material is a material whose conduction-band potential is the same as or more positive than conduction-band potential of the thermoelectric conversion material. A difference between the conduction-band potential of the electron transport material and the conduction-band potential of the thermoelectric conversion material is, for example, 0.01V or more and 0.1V or less. The electron transport material is, for example, a semiconductor material, a metal material, an electron transporting organic substance, or the like. The electron transport layer 22b is formed by, for example, a squeegee method, a screen printing method, a discharge plasma sintering method, a compression molding method, a sputtering method, a vacuum deposition method, a CVD method, a spin coating method, or the like.

The semiconductor material is, for example, the same as the semiconductor material included in the electron thermal excitation layer 22a. The metal material is, for example, a metal, an alloy, an N-type metal oxide, an N-type metal sulfide, an alkali metal halide, an alkali metal, or the like. N-type metals are, for example, niobium, titanium, zinc, tin, vanadium, indium, tungsten, tantalum, zirconium, molybdenum, and manganese. The electron transporting organic substance is, for example, an N-type conductive polymer, an N-type low molecular weight organic semiconductor, a π-electron conjugated compound, or the like. The electron transport layer 22b may include a plurality of electron transport materials. The electron transport layer 22b may include a material other than the electron transport material. For example, the electron transport layer 22b may include a binder for binding the electron transport material, a sintering aid for assisting the molding of the electron transport material, and the like.

The electron transport layer 22b may have a single-layer structure or a multi-layer structure. For example, the electron transport layer 22b may be a stack of a metal layer and a semiconductor layer. In this case, the semiconductor layer may be in contact with the electron thermal excitation layer 22a. From the viewpoint of preventing or inhibiting the chemical reaction of the metal layer, the metals included in the metal layer is, for example, titanium, gold, platinum, silver, tungsten, tantalum, and the like. In one example, the metal layer is a platinum layer (Pt layer) and the semiconductor layer is an n-type Si layer. The n-type Si layer is formed, for example, by doping a silicon layer with phosphorus or the like.

The solid electrolyte layer 23 is a layer including a solid electrolyte in which a charge transport ion pair can move inside at a temperature at which a sufficient number of thermal excitation electrons are generated in the thermoelectric body 3. As the above-described charge transport ion pair moves in the solid electrolyte layer 23, a current flows through the solid electrolyte layer 23. The "charge transport ion pair" is a stable pair of ions with different valences. When one ion is oxidized or reduced, it becomes the other ion and can move the electron and the hole. An oxidation-reduction potential of the charge transport ion pair in the solid electrolyte layer 23 is more negative than the valence electron-band potential of the thermoelectric conversion material included in the electron thermal excitation layer 22a. Therefore, at an interface between the electron thermal excitation layer 22a and the solid electrolyte layer 23, the easily oxidizable ions among the charge transport ion pairs are oxidized and become the other ions. The solid electrolyte layer 23 may include ions other than the charge transport ion pair. The solid electrolyte layer 23 can be formed by, for example, a squeegee method, a screen printing method, a sputtering method, a vacuum deposition method, a CVD method, a sol-gel method, or a spin coating method.

The solid electrolyte included in the solid electrolyte layer 23 is, for example, a substance that is physically and chemically stable at the above-described temperature, and includes multivalent ions. The solid electrolytes include, for example, a sodium ion conductor, a copper ion conductor, an iron ion conductor, a lithium ion conductor, a silver ion conductor, a hydrogen ion conductor, a strontium ion conductor, an aluminum ion conductor, a fluorine ion conductor, a chloride ion conductor, an oxide ion conductor, or the like. The solid electrolyte may be, for example, polyethylene glycol (PEG) having a molecular weight of 600,000 or less or a derivative thereof. When the solid electrolyte is PEG, a multivalent ion source such as a copper ion or an iron ion may be included in the solid electrolyte layer 23. From the viewpoint of improving the life, the solid electrolyte layer 23 may include an alkali metal ion. The molecular weight of PEG corresponds to the weight average molecular weight measured by gel permeation chromatography in terms of polystyrene. The solid electrolyte layer 23 may include a material other than the solid electrolyte. For example, the solid electrolyte layer 23 may include a binder for binding the solid electrolyte, a sintering aid for assisting the molding of the solid electrolyte, and the like.

Figure 2:
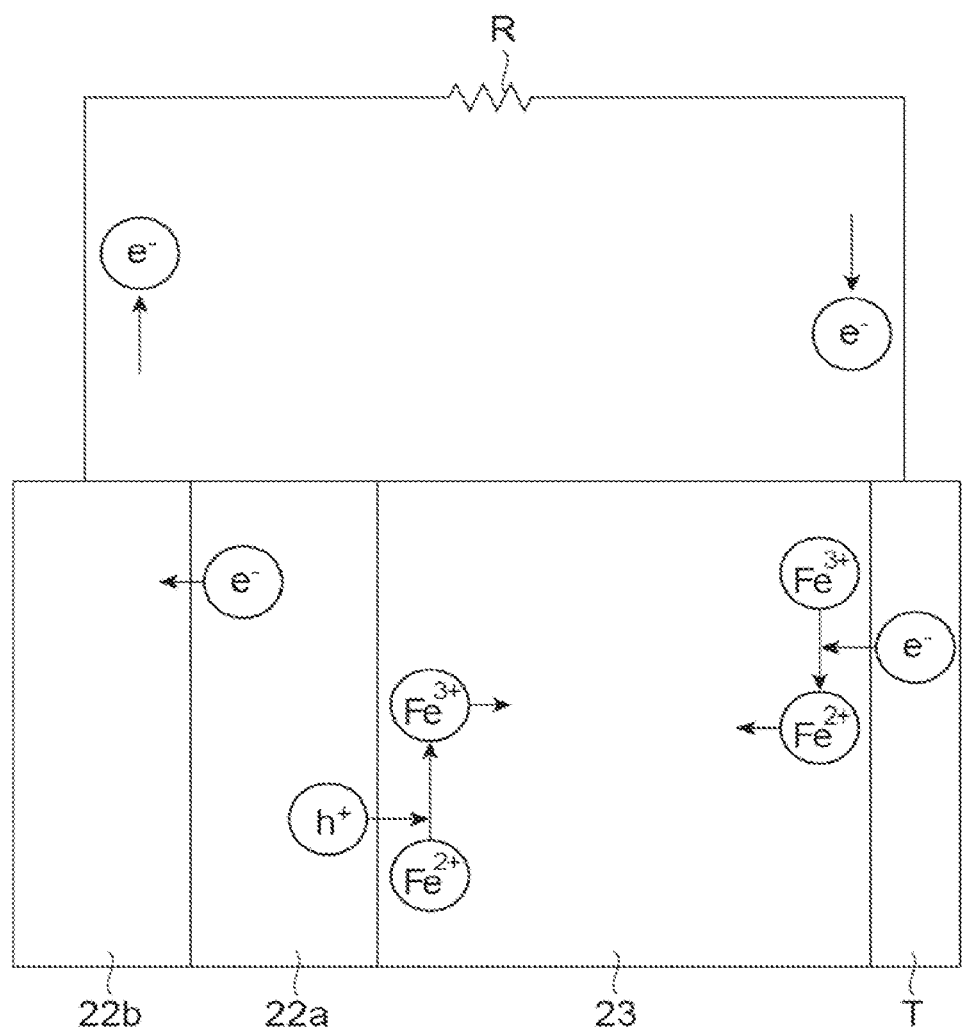
FIG. 2 is a schematic diagram illustrating a power generating mechanism of a heat-utilizing power generating element.

Here, the outline of the power generating mechanism of the heat-utilizing power generating element will be described with reference to FIG. 2. FIG. 2 is a schematic diagram illustrating a power generating mechanism of a heat-utilizing power generating element. For the sake of explanation, the charge transport ion pair included in the solid electrolyte layer 23 in this paragraph is referred to as iron ion ($Fe^{2+}$ and $Fe^{3+}$). An electron $e^-$ excited by the electron thermal excitation layer 22a is generated under a high-temperature environment. The electron $e^-$ move to the electron transport layer 22b. As a result, a hole $h^+$ is generated in the electron thermal excitation layer 22a. The hole $h^+$ oxidizes $Fe^{2+}$ at a first interface between the electron thermal excitation layer 22a and the solid electrolyte layer 23. That is, the hole $h^+$ robs the $Fe^{2+}$ electron at the first interface. As a result, $Fe^{2+}$ located at the first interface becomes $Fe^{3+}$. On the other hand, the excess electrons $e^-$ in the electron transport layer 22b move to the outside, pass through a resistor R and a terminal T, and reach the solid electrolyte layer 23. The electron $e^-$ that has reached the solid electrolyte layer 23 reduces $Fe^{3+}$ at a second interface between the solid electrolyte layer 23 and the terminal T. As a result, $Fe^{3+}$ located at the second interface becomes $Fe^{2+}$. Then, $Fe^{3+}$ oxidized at the first interface is diffused toward the second interface, and $Fe^{2+}$ reduced at the second interface is diffused toward the first interface. As a result, the above-described oxidation-reduction reaction between the first interface and the second interface is maintained. The heat-utilizing power generating element 21 generates power by generating electrons due to such thermal excitation and generating the oxidation-reduction reaction. The work that occurs when an electron passes through the resistor R corresponds to power generation.

Returning to FIG. 1, the compressible conductor 4 is a member that fills a gap between the case 2 and the thermoelectric body 3 in the stacked direction, and is sandwiched between the case 2 and the thermoelectric body 3 in the stacked direction. In the present embodiment, the compressible conductor 4 is located between the thermoelectric body 3 and the lid 12 in the stacked direction, and is in contact with the solid electrolyte layer 23 of the thermoelectric body 3 and the top plate 12a of the lid 12. The compressible conductor 4 is, for example, a metal porous body. When the thermoelectric body 3 and the compressible conductor 4 are sealed in the case 2, the compressible conductor 4 can be compressed and deformed. The metal porous body is a three-dimensional porous metal body provided with a plurality of pores, and the pores in the metal porous body may be connected to each other or separated from each other. The metal porous body may be formed in a mesh shape when viewed from the stacked direction. In this case, each mesh viewed from the stacked direction exhibits a polygonal shape such as a diamond shape or a hexagonal shape. The metal porous body may be, for example, a processed product of expanded metal.

From the viewpoint of reducing the pressure applied to the thermoelectric body 3, the compressible conductor 4 may have a significantly smaller elastic force than a metal spring or the like. That is, from the above-described viewpoint, the compressible conductor 4 may be a member that is plastically deformed. From the viewpoint of reducing the pressure applied to the thermoelectric body 3 when the thermoelectric cell 1 is heated, the compressible conductor 4 may be formed of an invariable steel plate. In this case, since the compressible conductor 4 is less likely to thermally expand, the pressure applied from the compressible conductor 4 to the thermoelectric body 3 can be satisfactorily reduced. When the compressible conductor 4 is used, the metal spring is not required, so that an internal receiving space of the case 2 is widened. Therefore, it is possible to provide a high voltage with the same volume.

The gasket 5 is an insulating member that fills the gap in the case 2. In the present embodiment, the gasket 5 fills a gap between the side wall 11b of the housing 11 and the side surface of the thermoelectric body 3. In addition, the gasket 5 covers the periphery of the side wall 12b of the lid 12. As a result, the gasket 5 satisfactorily prevents a short circuit between the housing 11 and the lid 12. The gasket 5 includes a resin material exhibiting heat resistance and insulating properties, and is, for example, a fluorine-containing resin.

Next, an example of a thermoelectric cell 1 manufacturing method according to the present embodiment will be described with reference to (a) to (c) of FIG. 3 and FIG. 4. (a) to (c) of FIG. 3 are diagrams illustrating a thermoelectric body manufacturing method, and FIG. 4 is a diagram illustrating a thermoelectric cell manufacturing method.

First, as shown in (a) and (b) of FIG. 3, the thermoelectric conversion layer 22 is formed by forming the electron thermal excitation layer 22a on the electron transport layer 22b. In the present embodiment, as shown in (a) of FIG. 3, the electron thermal excitation layer 22a is formed on the electron transport layer 22b by sputtering a semiconductor material target 41 constituting the electron thermal excitation layer 22a. The electron transport layer 22b is formed in advance on a temporary substrate or the like by, for example, a method described later.

Next, as shown in (b) and (c) of FIG. 3, the heat-utilizing power generating element 21 is formed by forming the solid electrolyte layer 23 on the thermoelectric conversion layer 22. In the present embodiment, as shown in (b) of FIG. 3, a substance constituting the solid electrolyte layer 23 supplied from a showerhead 51 is layered on the thermoelectric conversion layer 22 by the CVD method, thereby the solid electrolyte layer 23 is formed. As a result, as shown in (c) of FIG. 3, the heat-utilizing power generating element 21 is formed.

Next, the electron transport layer 22b is formed on the heat-utilizing power generating element 21 by sputtering an electron transport material target 42 constituting the electron transport layer 22b. In this way, by multiple times repeatedly forming each of the layers shown in (a) to (c) of FIG. 3, the thermoelectric body 3 having the plurality of heat-utilizing power generating elements 21 is formed.

Next, as shown in FIG. 4, the thermoelectric body 3 and the compressible conductor 4 are prepared. Subsequently, the thermoelectric body 3 and the compressible conductor 4 are accommodated in the housing 11. At this time, after disposing the thermoelectric body 3 on the bottom plate 11a of the housing 11, the compressible conductor 4 is disposed on the thermoelectric body 3. In addition, the gasket 5 is provided such that the side wall 11b of the housing 11 and the side surface of the thermoelectric body 3 are electrically insulated.

Subsequently, the thermoelectric body 3 and the compressible conductor 4 are sealed by combining the housing 11 and the lid 12 with the gasket 5 interposed therebetween. At this time, the side wall 12b of the lid 12 is embedded in the gasket 5. As a result, the insulated state between the side wall 12b of the lid 12, the side wall 11b of the housing 11, the side surface of the thermoelectric body 3, and the side surface of the compressible conductor 4 is ensured. That is, the side wall 12b of the lid 12, the side wall 11b of the housing 11, the side surface of the thermoelectric body 3, and the side surface of the compressible conductor 4 are electrically insulated. Then, by crimping the housing 11 and the lid 12, the thermoelectric cell 1 shown in FIG. 1 can be manufactured.

The thermoelectric cell 1 manufactured by the manufacturing method according to the present embodiment described above includes a thermoelectric body 3 that generates power by applying heat. The thermoelectric body 3 has a plurality of heat-utilizing power generating elements 21 that are layered in the stacked direction. As a result, the electromotive force of the thermoelectric cell 1 can be improved, so that the thermoelectric cell 1 can satisfactorily exhibit the function as a power source for electronic components. Each heat-utilizing power generating element 21 has the thermoelectric conversion layer 22 and the solid electrolyte layer 23. As a result, the thermoelectric cell 1 installed under a high-temperature environment can supply electrical energy to the connected electronic components for a long period of time by converting heat into electricity. A current collector required for a normal cell can be omitted between the plurality of heat-utilizing power generating elements 21.

In addition, the compressible conductor 4 is also accommodated in the case 2 that accommodates the thermoelectric body 3. By filling the gap between the case 2 and the thermoelectric body 3 with the compressible conductor 4, poor contact between the case 2 and the thermoelectric body 3 can be satisfactorily prevented. In addition, the thermoelectric body 3 is less likely to undergo expansion due to use and thermal expansion as compared with a lithium secondary cell or the like. Therefore, a contact surface pressure between the thermoelectric body 3 and the case 2 (housing 11 and lid 12) is less likely to change as compared with a lithium secondary cell or the like. Therefore, for example, even when the compressible conductor 4 is used instead of the spring as shown in Patent Literature 1, the decrease in current density is sufficiently prevented. Further, it is possible to prevent unnecessary pressure from being applied to the thermoelectric body 3, so that damage to the thermoelectric body 3 can be reduced. Accordingly, according to the present embodiment, it is possible to provide a thermoelectric cell 1 that can be practically used under a high-temperature environment.

In addition, the thermoelectric cell 1 according to the present embodiment can be miniaturized and thinned. Therefore, for example, the thermoelectric cell 1 can be used as a power source for electronic components such as sensors disposed under a high-temperature environment.

In the present embodiment, the thermoelectric conversion layer 22 has the electron thermal excitation layer 22a and the electron transport layer 22b that are sequentially layered, and the electron thermal excitation layer 22a is in contact with the solid electrolyte layer 23. Therefore, since the electrons are satisfactorily taken out from the electron thermal excitation layer 22a, the performance of the thermoelectric body 3 can be improved. In addition, even when the current collector is not provided between the heat-utilizing power generating elements 21, the thermoelectric body 3 can exhibit good performance.

In the present embodiment, the compressible conductor 4 may be a metal porous body. In this case, since the elasticity of the compressible conductor 4 can be reduced, the pressure applied from the case 2 to the thermoelectric body 3 via the compressible conductor 4 can be reduced. Therefore, damage to the thermoelectric body 3 can be satisfactorily reduced.

Hereinafter, modification examples of the above-described embodiment will be described with reference to (a) and (b) of FIG. 5. In the following explanation of each modification example, the description overlapping with the above-described embodiment will be omitted. Therefore, in the following, only the parts different from the above-described embodiment will be described. (a) of FIG. 5 is a schematic cross-sectional diagram showing a thermoelectric cell according to a first modification example of an embodiment, and (b) of FIG. 5 is a schematic cross-sectional diagram showing a thermoelectric cell according to a second modification example of an embodiment.

The thermoelectric cell 1A shown in (a) of FIG. 5 includes another compressible conductor 4A instead of the compressible conductor 4. The compressible conductor 4A is located between the bottom plate 11a of the housing 11 and the thermoelectric body 3 in the stacked direction. The compressible conductor 4A is in contact with the bottom plate 11a and the electron transport layer 22b of the thermoelectric body 3. On the other hand, in the first modification example, the top plate 12a of the lid 12 is in direct contact with the solid electrolyte layer 23. Also in such a first modification example, the same action and effect as those of the above-described embodiment are exhibited.

The thermoelectric cell 1B shown in (b) of FIG. 5 includes both compressible conductors 4 and 4A. Also in such a second modification example, the same action and effect as those of the above-described embodiment are exhibited. In addition, poor contact between the case 2 and the thermoelectric body 3 can be satisfactorily prevented.

The thermoelectric cell, the thermoelectric cell manufacturing method, and the thermoelectric body manufacturing method according to the present invention are not limited to the above-described embodiment and the above-described modification examples, and various other modifications are possible. For example, in the above-described embodiment and the above-described modification examples, the thermoelectric conversion layer includes an electron transport layer, but the present invention is not limited to this. That is, the thermoelectric conversion layer may not include the electron transport layer.

REFERENCE SIGNS LIST

1, 1A, 1B: thermoelectric cell
2: case
3: thermoelectric body
4,4A: compressible conductor
5: gasket
11: housing
11a: bottom plate
11b: side wall
12: lid
12a: top plate
12b: side wall
21: heat-utilizing power generating element
22: thermoelectric conversion layer
22a: electron thermal excitation layer
22b: electron transport layer
23: solid electrolyte layer

The invention claimed is:

1. A thermoelectric cell comprising:
a thermoelectric body including heat-utilizing power generating elements in each of which a thermoelectric conversion layer and a solid electrolyte layer are layered, the thermoelectric body being configured to convert thermal energy into electrical energy;
a conductive case including a first case body and a second case body which are combined and accommodating the thermoelectric body;
an insulating member configured to electrically insulate either of the first case body or the second case body from the solid electrolyte layer on a side surface of the thermoelectric body while the insulating member is configured to electrically insulate the first case body and the second case body; and
a compressible conductor accommodated in the conductive case and disposed between the thermoelectric body and the conductive case,
wherein the first case body, the thermoelectric body, and the second case body are electrically connected in a stacked direction of the thermoelectric conversion layer and the solid electrolyte layer by disposing the compressible conductor on a side of at least one of the first case body and the second case body,
wherein the compressible conductor is in contact with the thermoelectric layer,
wherein the thermoelectric conversion layer includes an electron thermal excitation layer and an electron transport layer layered in the stacked direction, and
wherein the compressible conductor is in contact with the electron transport layer.

2. The thermoelectric cell according to claim 1, wherein the electron thermal excitation layer is in contact with the solid electrolyte layer.

3. The thermoelectric cell according to claim 1, wherein the compressible conductor is a metal porous body.

4. The thermoelectric cell according to claim 1, further comprising a second compressible conductor accommodated in the conductive case and disposed between the thermoelectric body and the conductive case,
wherein the compressible conductor is disposed on the side of the first case body, and
wherein the second compressible conductor is disposed on the side of the second case body.

5. The thermoelectric cell according to claim 1, wherein each of the first case body and the second case body has a bottomed cylindrical shape in which one end is closed and an other end is open.

6. The thermoelectric cell according to claim 1, wherein the first case body includes a first plate and a first side wall extending along an edge of the first plate, and the second case body includes a second plate and a second side wall extending along an edge of the second plate.

7. The thermoelectric cell according to claim 1, wherein the compressible conductor is maintained in a compression state by being sandwiched between the thermoelectric body and the conductive case such that the compressible conductor fills a gap formed between the thermoelectric body and the conductive case.

8. The thermoelectric cell according to claim 3, wherein the compressible conductor is formed of an invariable steel.

9. A method for manufacturing a thermoelectric cell, comprising:
obtaining a thermoelectric body by forming heat-utilizing power generating elements in each of which a thermoelectric conversion layer and a solid electrolyte layer are layered;
accommodating the thermoelectric body and a compressible conductor in either a first case body or a second case body, both of the first case body and the second case body having conductivity; and
combining the first case body and the second case body with an insulating member interposed therebetween such that the first case body or the second case body accommodating the thermoelectric body and a side surface of the thermoelectric body are configured to be electrically insulated and the first case body and the second case body are configured to be electrically insulated,
wherein the compressible conductor is in contact with the thermoelectric layer,
wherein the thermoelectric conversion layer includes an electron thermal excitation layer and an electron transport layer layered on each other, and
wherein the compressible conductor is in contact with the electron transport layer.

10. The method according to claim 9, wherein the first case body includes a first plate and a first side wall extending along an edge of the first plate, and the second case body includes a second plate and a second side wall extending along an edge of the second plate.

11. The method according to claim 9, wherein the compressible conductor is maintained in a compression state by being sandwiched between the thermoelectric body and either of the first case body or the second case body such that the compressible conductor fills a gap formed between the thermoelectric body and either of the first case body or the second case body.

12. The method according to claim 9, wherein the electron thermal excitation layer is in contact with the solid electrolyte layer.

13. The method according to claim 12, wherein the compressible conductor is formed of an invariable steel.

14. A thermoelectric cell comprising:
a conductive case including a first case body and a second case body;
a heat-utilizing power generating element accommodated in the conductive case, the heat-utilizing power generating element including a thermoelectric conversion layer and a solid electrolyte layer stacked in order;
an insulating member configured to electrically insulate either of the first case body or the second case body from the solid electrolyte layer on a side surface of the heat-utilizing power generating element while the insulating member is configured to electrically insulate the first case body and the second case body; and
a compressible conductor accommodated in the conductive case and disposed between the heat-utilizing power generating element and the conductive case,
wherein the first case body, the heat-utilizing power generating element, and the second case body are electrically connected to each other,
wherein the compressible conductor is in contact with the thermoelectric layer,
wherein the thermoelectric conversion layer includes an electron thermal excitation layer and an electron transport layer layered on each other, and
wherein the compressible conductor is in contact with the electron transport layer.

15. The thermoelectric cell according to claim 14, wherein the compressible conductor is in contact with the electron transport layer.

16. The thermoelectric cell according to claim 14, wherein the first case body includes a first plate and a first side wall extending along an edge of the first plate, and the second case body includes a second plate and a second side wall extending along an edge of the second plate.

17. The thermoelectric cell according to claim 14, wherein the compressible conductor is maintained in a compression state by being sandwiched between the heat-utilizing power generating element and the conductive case such that the compressible conductor fills a gap formed between the heat-utilizing power generating element and the conductive case.

* * * * *